(12) United States Patent
Wang (10) Patent No.: US 9,704,927 B2
(45) Date of Patent: Jul. 11, 2017

(54) ORGANIC ELECTROLUMINESCENT DISPLAY PANEL

(71) Applicant: BOE TECHNOLOGY GROUP CO., LTD., Beijing (CN)

(72) Inventor: Huifeng Wang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 64 days.

(21) Appl. No.: 14/428,889

(22) PCT Filed: Jun. 13, 2014

(86) PCT No.: PCT/CN2014/079845
§ 371 (c)(1),
(2) Date: Mar. 17, 2015

(87) PCT Pub. No.: WO2015/113357
PCT Pub. Date: Aug. 6, 2015

(65) Prior Publication Data
US 2016/0013252 A1    Jan. 14, 2016

(30) Foreign Application Priority Data
Jan. 29, 2014    (CN) .......................... 2014 1 0043709

(51) Int. Cl.
*H01L 27/32*    (2006.01)
*G09G 3/20*    (2006.01)
*G09G 3/3225*    (2016.01)

(52) U.S. Cl.
CPC ...... *H01L 27/3218* (2013.01); *H01L 27/3213* (2013.01); *H01L 27/3248* (2013.01);
(Continued)

(58) Field of Classification Search
None
See application file for complete search history.

(56) References Cited

U.S. PATENT DOCUMENTS 9,048,449 B2 *   6/2015   Kim ....................... H01L 51/52
2003/0160915 A1   8/2003   Liu
(Continued)

FOREIGN PATENT DOCUMENTS

CN   1551383 A    12/2004
CN   1738501      2/2006
(Continued)

OTHER PUBLICATIONS

Office Action in Chinese Patent Application No. 201410043709.X, dated Oct. 27, 2015.
(Continued)

*Primary Examiner* — Kenneth B Lee, Jr.
(74) *Attorney, Agent, or Firm* — Brooks Kushman P.C.

(57) ABSTRACT

Disclosed is an organic electroluminescent display panel, which includes a plurality of RGBW subpixel units, wherein each R subpixel unit includes 4 R subpixel elements, each G subpixel unit includes 4 G subpixel elements, each B subpixel unit includes 4 B subpixel elements, each W subpixel unit includes 4 W subpixel elements, and two adjacent subpixel units emit light in different colors, respectively. The R subpixel element, the G subpixel element, the B subpixel element and the W subpixel element form a pixel region of the display panel.

14 Claims, 5 Drawing Sheets

(52) U.S. Cl.
CPC ....... *H01L 27/3276* (2013.01); *G09G 3/2003* (2013.01); *G09G 3/3225* (2013.01); *G09G 2300/0426* (2013.01); *G09G 2300/0452* (2013.01); *H01L 27/3262* (2013.01); *H01L 2251/55* (2013.01)

(56) References Cited

U.S. PATENT DOCUMENTS

| | | | |
|---|---|---|---|
| 2010/0207851 | A1 | 8/2010 | Cok et al. |
| 2010/0220117 | A1* | 9/2010 | Kimura ................ G09G 3/3233 345/690 |

FOREIGN PATENT DOCUMENTS

| | | | |
|---|---|---|---|
| CN | 1753588 | A | 3/2006 |
| CN | 101021648 | | 8/2007 |
| CN | 101325027 | A | 12/2008 |
| CN | 101819987 | | 9/2010 |
| CN | 102262854 | A | 11/2011 |
| CN | 102714000 | A | 10/2012 |
| CN | 102810285 | A | 12/2012 |
| CN | 102830450 | A | 12/2012 |
| CN | 102830452 | A | 12/2012 |
| CN | 102830454 | A | 12/2012 |
| CN | 103208507 | A | 7/2013 |
| CN | 103762224 | A | 4/2014 |
| CN | 104009066 | A | 8/2014 |
| TW | 200706061 | A | 2/2007 |

OTHER PUBLICATIONS

International Search Report and Written Opinion in PCT International Application No. PCT/CN2014/079845, dated Nov. 3, 2014.
Chinese Office Action, dated Apr. 25, 2016.
Office Action in Chinese Patent Application No. 201410043709.X, dated Jul. 18, 2016.

* cited by examiner

ORGANIC ELECTROLUMINESCENT DISPLAY PANEL

CROSS-REFERENCE TO RELATED APPLICATION

The present application is the U.S. national phase of PCT Application No. PCT/CN2014/079845 filed on Jun. 13, 2014, which claims a priority of the Chinese Patent Application No, 201410043709.X filed on Jan. 29, 2014, which is incorporated by reference herein in its entirety.

TECHNICAL FIELD

The present disclosure relates to the field of organic electroluminescent display technology, in particular to an organic electroluminescent display panel.

BACKGROUND

Organic electroluminescent display panel, as a novel flat panel display device, has the advantages of self-luminescence, low cost, fast response speed, wide visual angle, low power consumption, high brightness, wide range of working temperature, being applicable for flexible display and simple manufacturing process, etc., thus it has a wide application prospect.

A conventional organic electroluminescent element generates electroluminescence due to a multi-layer structure thereof, which includes an anode layer, a cathode layer and an organic electroluminescent material layer arranged therebetween. Based on the materials used, the organic electroluminescent element may be divided into two types: one is a small molecule light-emitting diode mainly made of a dye or a pigment, which is referred to as Organic Light-Emitting Diode (OLED) or Organic Electroluminescence (OEL); and the other is a polymer light-emitting diode mainly made of high molecules, which is referred to as Polymer Light-Emitting Diode (PLED) or Light-Emitting Polymer (LEP). In addition, based on the color of light emitted by the organic electroluminescent element, the organic electroluminescent material layer may mainly be made of three materials, i.e., RED (R), Green (G) and Blue (B) materials. In order to realize full-color display, each pixel unit of the organic electroluminescent display panel includes RGB subpixel units, and an organic electroluminescent element that emits the light in a single color corresponds to a subpixel unit.

A film deposition method for the organic electroluminescent display device mainly includes vacuum evaporation processing and solution processing. The vacuum evaporation processing is applicable for organic small molecules, and as a relatively mature technology, it is able to improve the evenness of a film. However, it also has the disadvantages of large investment for equipment, low utilization rate of material and low precision of mask alignment for large-sized products. Additionally, the solution processing includes spin coating, ink-jet printing, nozzle coating, etc., and it is applicable for polymer materials and soluble small molecules. Moreover, it has the feature of low equipment cost, so it is especially advantageous to large-scale production as well as large-sized products.

For the vacuum evaporation processing, although it has been employed in the mass production for small and medium-sized organic electroluminescent display devices, the resolution thereof cannot match a liquid crystal display (LCD). In the production of large-sized organic electroluminescent display devices, because the precision of mask alignment is low in the manufacture process of subpixel units, it is difficult to achieve the mass production. In addition, for the solution processing, although prototypes for large and small-sized organic electroluminescent display devices appear continuously, the mass production thereof does not begin yet. Further, as limited by the precision of the film-forming equipment, the resolution thereof is not high.

Thus, it is difficult in the OLED industry to manufacture an OLED device with a high resolution. At present, although there exist many different pixel designs, i.e., the well-know pixel arrangement modes such as square, side by side, pentile and stripe, these pixel designs are only limited to changes in the arrangement modes of the pixels themselves, and the actual resolution thereof is not improved greatly. At the same time, with respect to the film-forming technology related to finely-patterned thin film transistors, due to limitations in the process and equipment, it is difficult for the vacuum evaporation processing and the solution processing to manufacture the organic electroluminescent display device with a high-precision pattern.

SUMMARY

Embodiments of the present disclosure aim to provide an organic electroluminescent display panel, thereby to improve the resolution of the organic electroluminescent display device, and the precision of mask alignment during the manufacture process.

In order to solve the above technical problem, the present disclosure provides in embodiments an organic electroluminescent display panel, which includes:

a substrate; and a plurality of subpixel units formed on the substrate and including a plurality of red-light (R) subpixel units, a plurality of green-light (G) subpixel units, a plurality of blue-light (B) subpixel units and a plurality of white-light (W) subpixel units, wherein each red-light subpixel unit includes 4 red-light (R) subpixel elements, each green-light subpixel unit includes 4 green-light (G) subpixel elements, each blue-light subpixel unit includes 4 blue-light (B) subpixel elements, each white-light subpixel unit includes 4 white-light (W) subpixel elements, and two adjacent subpixel units emit light in different colors; wherein the red-light subpixel elements, the green-light subpixel elements, the blue-light subpixel elements and the white-light subpixel elements form a plurality of pixel regions of the display panel.

The present disclosure has the following beneficial effects. According to embodiments of the present disclosure, each subpixel unit includes 4 subpixel elements that emit the light in the same color, so it is able to improve the precision of mask alignment during the manufacture process of the subpixel unit. At the same time, because an area of each subpixel element is ¼ of that of each subpixel unit, the resolution of the organic electroluminescent display panel may be greatly improved by 4 times in contrast to the original resolution.

BRIEF DESCRIPTION OF THE DRAWINGS

In order to more clearly illustrate the technical solutions of the embodiments of the present disclosure or of the prior art, the drawings needed in the description of the embodiments will be briefly introduced below. Apparently, the following drawings only relate to some embodiments of the present disclosure, and based on these drawings, the other drawings may also be obtained by one of ordinary skills in the art without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to improve the resolution of an organic electroluminescent display panel and the precision of mask alignment during the manufacture process of a subpixel unit, embodiments of the present disclosure provide an organic electroluminescent display panel. According to embodiments of the present disclosure, each subpixel unit includes a plurality of subpixel elements that emit light in the same color, so it is able to improve the precision of mask alignment during the preparation process of the subpixel unit. Moreover, two adjacent subpixel units emit light in different colors, and a plurality of subpixel elements that emit the light in different colors form a pixel region of the display panel, so as to realize full-color display. At the same time, because an area of each subpixel element is smaller than that of each subpixel unit, the resolution of the organic electroluminescent display panel may be greatly improved.

Figure 1:
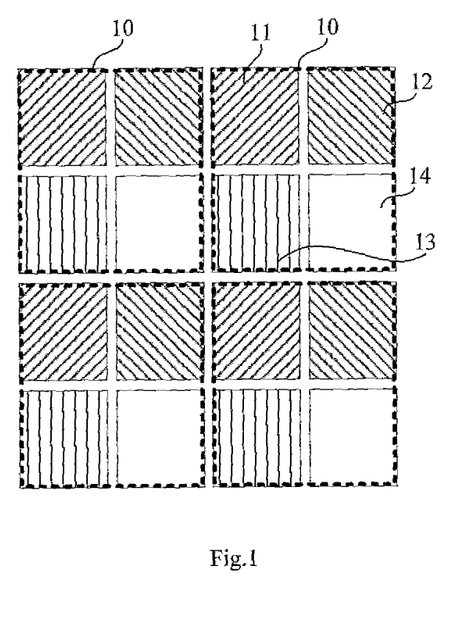
FIG. 1 is a schematic diagram showing an arrangement of RGBW subpixel units in a conventional organic electroluminescent display panel.

For a conventional full-color organic electroluminescent display panel, it generally includes a red-light (R) subpixel unit, a green-light (G) subpixel unit and a blue-light (B) subpixel unit. Further, as shown in FIG. 1, in order to lower the power consumption and improve the brightness of the display panel, there appears an organic electroluminescent display panel that includes RGB subpixel units and a white-light (W) subpixel unit.

The organic electroluminescent display panel according to an embodiment of the disclosure includes RGBW subpixel units, thus it is able to improve the brightness of the display panel and lower the power consumption while improving the resolution thereof.

Figure 2:
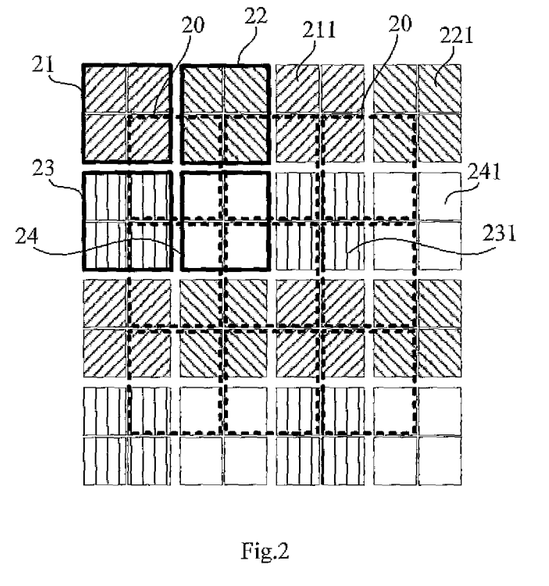
FIG. 2 is a schematic diagram showing an arrangement of RGBW subpixel units in an organic electroluminescent display panel according to an embodiment of the present disclosure.
Figure 5:
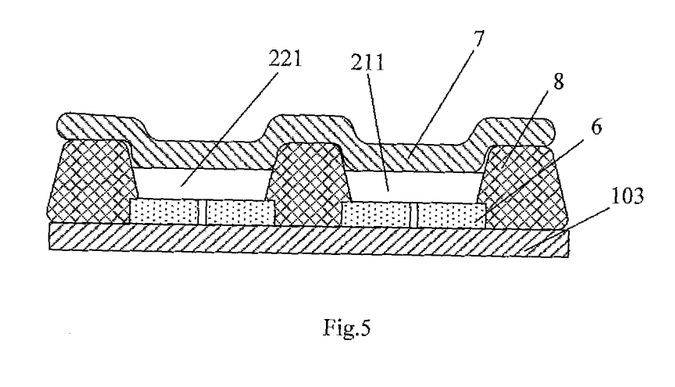
FIG. 5 is a schematic view showing an organic electroluminescent element formed above a thin film transistor according to an embodiment of the present disclosure.
Figure 7:
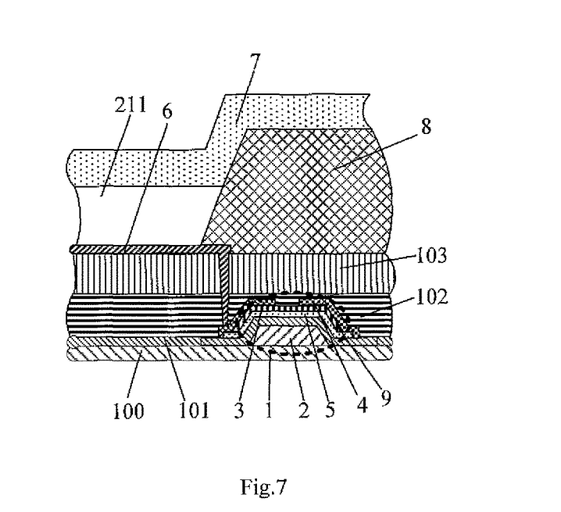
FIG. 7 is a partial, schematic view showing one red-light subpixel element and a thin film transistor for driving it to emit light according to an embodiment of the present disclosure.

Referring to FIGS. 2, 5 and 7, the organic electroluminescent display panel according to embodiments of the present disclosure may include:

a substrate 100, which may be, for example, a glass substrate, a quartz substrate or an organic resin substrate having a high transmittance; and a plurality of subpixel units formed on the substrate 100 and including a plurality of red-light (R) subpixel units 21, a plurality of green-light (0) subpixel units 22, a plurality of blue-light (B) subpixel units 23 and a plurality of white-light (W) subpixel units 24, wherein each red-light subpixel unit 21 includes 4 red-light (R) subpixel elements 211, each green-light subpixel unit 22 includes 4 green-light (G) subpixel elements 221, each blue-light subpixel unit 23 includes 4 blue-light (B) subpixel elements 231, and each white-light subpixel unit 24 includes 4 white-light (W) subpixel elements 241, two adjacent subpixel units emit light in different colors, and wherein the red-light subpixel elements 211, the green-light subpixel elements 221, the blue-light subpixel elements 231 and the white-light subpixel elements 241 form a plurality of pixel regions 20 of the display panel, thereby to realize full-color display.

In this embodiment, each pixel region 20 may only include one red-light (R) subpixel element 211, one green-light (G) subpixel element 221, one blue-light (B) subpixel element 231 and one white-light (W) subpixel element 241, so as to realize the full-color, low-power consumption, high-resolution and high-brightness display.

In an embodiment of the present disclosure, the pixel region of the organic electroluminescent display panel includes RGBW subpixel elements, so as to realize the full-color, high-brightness and low-power consumption display. Each subpixel unit includes 4 subpixel elements that emit the light in the same color, so it is able to improve the precision of mask alignment during the manufacture process of the subpixel unit. At the same time, referring to FIGS. 1 and 2, in embodiments of the present disclosure, because an area of each subpixel element is ¼ of that of each subpixel unit, in the case that the areas of the subpixel units 21, 22 and 23 are the same as those of the subpixel units 11, 12 and 13 of an conventional organic electroluminescent display panel, respectively, the area of the pixel region 20 in embodiments of the present disclosure is ¼ of that of the pixel region 10 of the conventional organic electroluminescent display panel, so that the resolution of the organic electroluminescent display panel may be greatly improved by 4 times in contrast to the original resolution.

In this embodiment, the subpixel element of each subpixel unit may be a small-molecule organic light-emitting diode element or a polymer organic light-emitting diode element.

Figure 3:
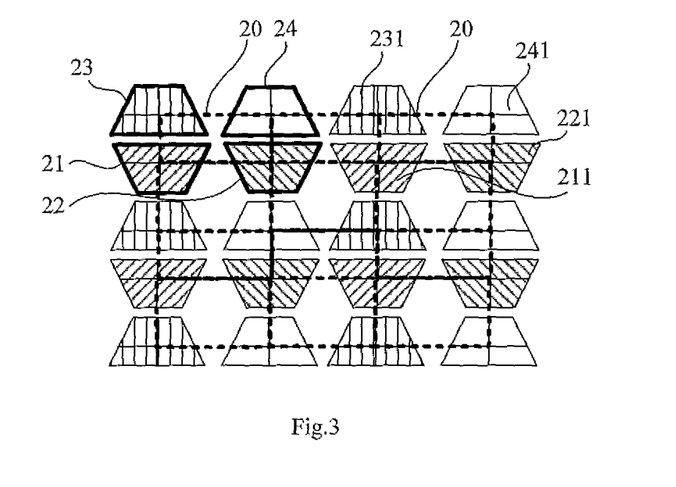
FIG. 3 is a schematic diagram showing an arrangement of RGBW subpixel units in the organic electroluminescent display panel according to another embodiment of the present disclosure.
Figure 4:
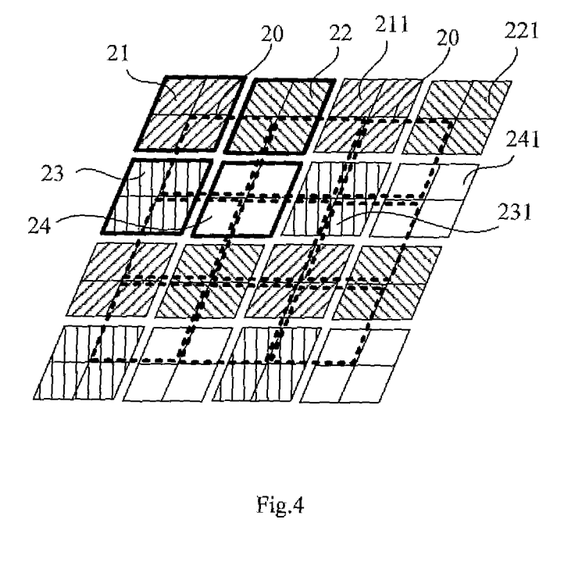
FIG. 4 is a schematic diagram showing an arrangement of RGBW subpixel units in an organic electroluminescent display panel according to yet another embodiment of the present disclosure.

For the subpixel element of each subpixel unit, it may have a regular pattern, for example, a rectangle (as shown in FIG. 2), a trapezoid (as shown in FIG. 3) or a diamond (as shown in FIG. 4), or it may have an irregular pattern.

Alternatively, the subpixel elements of each subpixel unit may have an identical shape, or have different shapes, for example, any combination of at least two of rectangle, trapezoid and diamond.

In the related art, based on different driving modes, organic electroluminescent display apparatus may be of a passive matrix driving type or an active matrix driving type. As the active matrix-driving organic electroluminescent display apparatus, the panel thereof is provided with thin film transistors, and each thin film transistor drives one pixel unit independently, so that all pixel units can emit light in one frame time. In addition, the active matrix-driving organic electroluminescent display apparatus has a low driving current, low power consumption and a long lifetime, so it is able to meet the requirements for the large-sized display with high-resolution. As a result, the active matrix-driving organic electroluminescent display apparatus is generally used.

The structure and the manufacture process of the active matrix-driving organic electroluminescent display panel will be illustrated in detail below.

Referring to FIGS. 2 and 5-7, the active matrix-driving organic electroluminescent display panel may include:

a substrate 100, on which banks 8 are formed in a crisscross manner for defining regions where subpixel units are located;

a plurality of red-light subpixel units 21, a plurality of green-light subpixel units 22, a plurality of blue-light subpixel units 23 and a plurality of white-light subpixel units 24, which are formed in the corresponding regions on the substrate 100, and wherein each red-light subpixel unit 21 includes 4 red-light subpixel elements 211, each green-light subpixel unit 22 includes 4 green-light subpixel elements 221, each blue-light subpixel unit 23 includes 4 blue-light subpixel elements 231, and each white-light subpixel unit 24 includes 4 white-light subpixel elements 241, and two adjacent subpixel units emit different color light, and wherein one red-light (R) subpixel element 211, one green-light (G) subpixel element 221, one blue-light (B) subpixel element 231 and one white-light (W) subpixel element 241 that are adjacent to each other form a pixel region 20 of the display panel; and a plurality of thin film transistors 1 electrically connected to the subpixel elements in a one-to-one correspondence manner, so as to drive the subpixel elements to emit light, wherein a source electrode of the thin film transistor 1 is electrically connected to a first electrode 6 (usually an anode) of the subpixel element.

Figure 6:
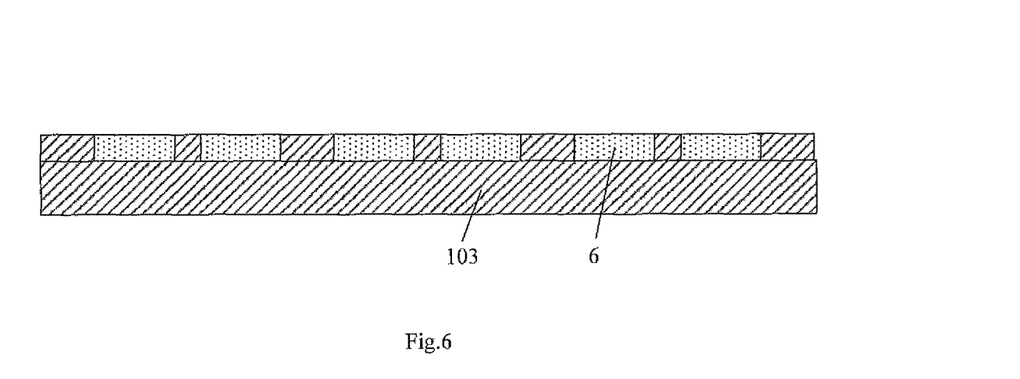
FIG. 6 is a partial, schematic view showing an anode of an organic electroluminescent element according to an embodiment of the present disclosure.

A process for forming the active matrix-driving organic electroluminescent display panel will be illustrated specifically below with reference to FIGS. 5-7 by taking a process for forming the red-light (R) subpixel element 211 and the corresponding thin film transistor 1 as an example. The process includes the following steps.

Step a: the thin film transistor 1 is formed on the substrate 100.

Specifically, Step a includes steps of forming a gate electrode 2, a gate insulating layer 101, an active layer pattern 5, a source electrode 3 and a drain electrode 4.

For a bottom-gate thin film transistor 1, first of all, a gate metal layer is formed on the substrate 100, a patterning process (it includes the steps of coating, exposing, developing, etching and peeling a photoresist, and unless otherwise stated, the patterning processes mentioned hereinafter all include the above steps) is performed on the gate metal layer to form a pattern of the gate electrode 2. Then, the gate insulating layer 101 is formed on the gate electrode 2. Next, a semiconductor layer is formed on the gate insulating layer 101, and a patterning process is performed on the semiconductor layer to form the active layer pattern 5. Finally, a source/drain metal layer is formed on the active layer pattern 5, and a patterning process is performed on the source/drain metal layer to form patterns of the source electrode 3 and the drain electrode 4. Prior to forming the source/drain metal layer on the active layer pattern 5, an etch stopping layer pattern 9 may be formed on the active layer pattern 5 so as to prevent the active layer pattern 5 from being adversely affected by the patterning process for forming the source electrode 3 and the drain electrode 4.

In addition, the thin film transistor 1 in this embodiment is not limited to be of the bottom-gate structure, and it may also be of a top-gate or a co-plane structure.

Step b: a passivation layer 102 and an overcoat 103 are formed in turn above the thin film transistor 1, a patterning process is performed on the passivation layer 102 and the overcoat 103 to form a via hole, and a plurality of grooves is formed on the surface of the overcoat 103.

The overcoat 103 may be formed, for example, by a film-forming process such as plasma enhanced chemical vapor deposition (PECVD), spinning, sputtering and ink-jet printing. A photoresist is coated on the overcoat 103, and then exposed by means of a halftone or graytone mask plate to form a photoresist-fully-reserved area, a photoresist-partially-reserved area and a photoresist-unreserved area. The photoresist-partially-reserved area at least corresponds to a region where a plurality of grooves is located, the photoresist-unreserved area at least corresponds to a region where the via hole is located, and the photoresist-fully-reserved area corresponds to other regions. The overcoat 103 and the passivation layer 102 at the photoresist-unreserved area are etched off by a first etching process to form the desired via hole. Then, the photoresist at the photoresist-partially-reserved area is peeled off, and a part of the overcoat 103 at the photoresist-partially-reserved area is etched off via a second etching process to form a plurality of grooves. Finally, the remaining photoresist is peeled off. As shown in FIG. 6, the plurality of grooves corresponds to a region where the first electrode 6 is located. By the above steps, it is able to maintain the surface of the display panel to be planar after with the subsequent formation of the first electrode 6, thereby to conveniently form the subpixel element 211 (which is formed by an organic electroluminescent material layer).

The material of the overcoat 103 may be, for example, an organic resin or inorganic material with good film-forming property and high insulating property as well as a surface capable of being close to the material of the first electrode 6. Additionally, the material of the overcoat 103 can be subjected to ultraviolet (UV), plasma or $O_3$ treatment during a common washing process prior to the film-forming process of an organic electroluminescent element. In an example, the material of the overcoat 103 may be, for example, $SiO_2$, ceramics, organosilicon resin or polyimide.

Step c: the organic electroluminescent element is formed on the overcoat 103.

The organic electroluminescent element includes the first electrode 6 (which is generally referred to as anode), a second electrode 7 (which is generally referred to as cathode), and the subpixel element 211 that is arranged between the first electrode 6 and the second electrode 7.

The subpixel elements may be of a top-emitting type and a bottom-emitting type. The bottom-emitting subpixel element is provided with a transparent anode 6 and a reflective cathode 7, while the top-emitting subpixel element is provided with a transparent cathode 7 and a reflective anode 6. The transparent anode 6 may be made of a transparent or semitransparent material, for example, ITO, IZO, Ag, NiO, Al and graphene.

Step c may include the following steps.

First of all, the first electrode 6 is formed in the groove of the overcoat 103. Specifically, for example, a conductive layer may be formed via a film-forming method such as evaporating, sputtering, coating and spinning, and then a patterning process may be performed on the conductive layer to form a pattern of the first electrode 6.

The first electrode 6 is located at a position corresponding to the red-light subpixel element 211, and electrically connected to the source electrode of the thin film transistor 1 through the via hole formed in Step b, so that it is controlled by the thin film transistor 1 independently. Moreover, the first electrodes 6 corresponding to different subpixel elements (including the adjacent subpixel elements that emit the light in the same color and the adjacent subpixel elements that emit the light in different colors) are insulated from each other.

In order to realize the absolute insulation among the first electrodes 6, every two of the 4 first electrodes 6 corresponding to each subpixel unit are configured to have a gap width of, for example, 100 nm to 500 μm, and preferably 5 μm to 100 μm.

Then, the banks 8 are formed on the overcoat 103 in a crisscross manner, for defining regions where the subpixel units are located.

For the vacuum evaporation processing, because each subpixel unit region includes 4 subpixel elements that emit the light in the same color, an increase in the area results in that the organic electroluminescent material layer for subsequently forming the subpixel units may be coated in a flat manner, and as a result, it is able to avoid defects caused by a nonuniform film formed at the edge of the bank 8. In addition, because the region corresponding to the subpixel elements is defined by the crisscross banks 8, it is able to avoid electric leakage caused by the nonuniform film formed at the edge of the bank 8.

Similarly, for the solution processing, because each subpixel unit region includes 4 subpixel elements that emit the light in the same color, the film-forming environment of the ink droplets for such 4 subpixel elements is the same, and it is able to to greatly improve the uniformity of the formed film. If the crisscross banks 8 are arranged to define the region corresponding to each subpixel element, then the film-forming area of such region is decreased, and inevitably a coffee ring phenomenon occurs at the edge of each subpixel element, resulting in an adverse influence on the film-forming quality.

Then, the organic electroluminescent material layer is formed on the first electrode 6. Typically, the organic electroluminescent material layer includes one or more of a hole injection layer, a hole transport layer, a luminescent layer, a hole blocking layer, an electron blocking layer, an electron transport layer and an electron injection layer. A patterning process is performed on the organic electroluminescent material layer to form the red-light subpixel element 211, which is located in the corresponding subpixel unit region.

Then, the second electrode 7 is formed on the red-light subpixel element 211, which is generally referred to as a cathode.

The cathode 7 may be a plate-shaped electrode that covers the whole substrate 100. At this time, the luminescence of the subpixel element may be controlled by only changing a voltage applied to the anode 6, thus the manufacturing process may be simplified.

The cathode 7 may be made of a metal such as Al, Mg, Ca, Ba, Na, Li, K or Ag, or a combination thereof.

All of the red-light subpixel units 21 may be manufactured at the same time by Step a to Step c.

Similarly, for the green-light subpixel units, the blue-light subpixel units and the white-light subpixel units, they may also be manufactured by the above steps in three processes, respectively.

However, the red-light subpixel units, the green-light subpixel units, the blue-light subpixel units and the white-light subpixel units may also be manufactured at the same time using the masks adopted in the manufacture processes of the above red-light subpixel units, green-light subpixel units, blue-light subpixel units and white-light subpixel units.

Finally, in order to prevent the organic electroluminescent display device from being destroyed by moisture and oxygen, it also needs to be packaged, and the typical packaging mode includes Frit packaging, Dam&Fill packaging, Film packaging, Metal packaging and Laminator packaging, etc.

Figure 8:
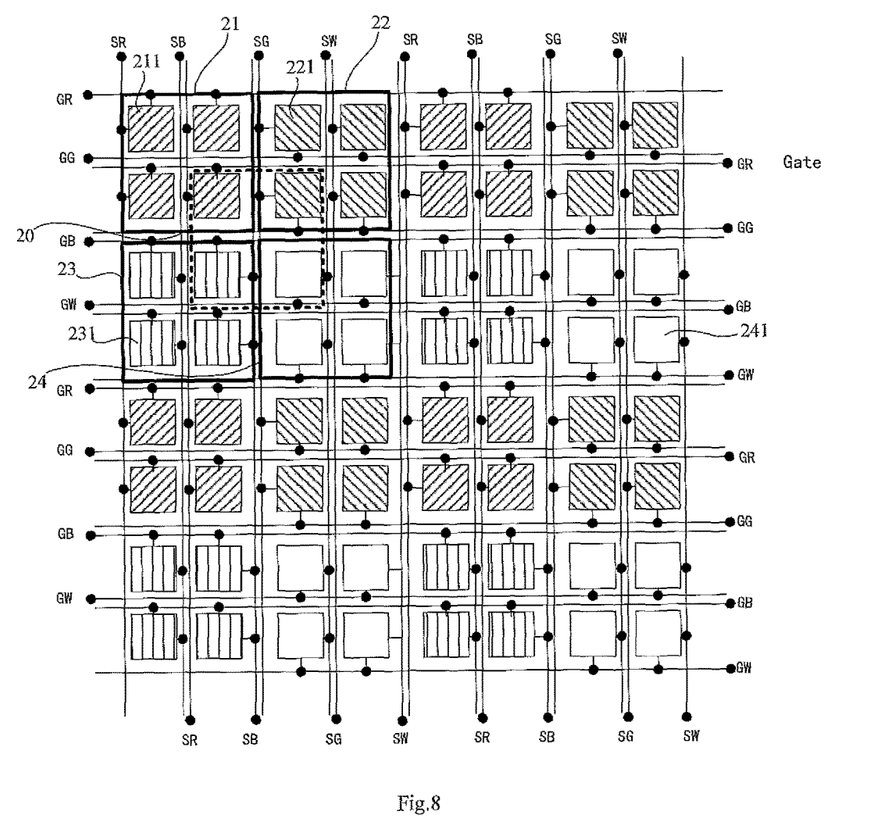
FIG. 8 is a schematic diagram showing a distribution of driver circuits of an organic electroluminescent display panel according to an embodiment of the present disclosure.

As shown in FIG. 8, the active matrix-driving organic electroluminescent display panel further includes a gate driver circuit (not shown), a source driver circuit (not shown), a plurality of gate driving wires distributed in rows and a plurality of source driving wires distributed in columns. The gate driver circuit is electrically connected to the gate driving wires, for inputting a gate driving signal to the gate driving wires, and the source driver circuit is electrically connected to the source driving wires, for inputting a source driving signal to the source driving wires.

The gate driving wires include;

red gate driving wires GR, which are electrically connected to gate electrodes of thin film transistors for driving the red-light subpixel elements 211, respectively, each row of the red gate driving wires GR being configured to drive the plurality of red-light subpixel elements 211 distributed in the same row;

green gate driving wires GG, which are electrically connected to gate electrodes of thin film transistors for driving the green-light subpixel elements 221, respectively, each row of the green gate driving wires GG being configured to drive the plurality of green-light subpixel elements 221 distributed in the same row;

blue gate driving wires GB, which are electrically connected to gate electrodes of thin film transistors for driving the blue-light subpixel elements 231, respectively, each row of the blue gate driving wires GB being configured to drive the plurality of blue-light subpixel elements 231 distributed in the same row; and white gate driving wires GW, which are electrically connected to gate electrodes of thin film transistors for driving the white-light subpixel elements 241, respectively, each row of the white gate driving wires GW being configured to drive the plurality of white-light subpixel elements 241 distributed in the same row.

The source driving wires include:

red source driving wires SR, which are electrically connected to source electrodes of thin film transistors for driving the red-light subpixel elements 211, respectively, each column of the red source driving wires SR being configured to drive the plurality of red-light subpixel elements 211 distributed in the same column;

green source driving wires SG; which are electrically connected to source electrodes of thin film transistors for driving the green-light subpixel elements 221, respectively, each column of the green source driving wires SG being configured to drive a plurality of green-light subpixel elements 221 distributed in the same column;

blue source driving wires SB, which are electrically connected to source electrodes of thin film transistors for driving the blue-light subpixel elements 231, respectively, each column of the blue source driving wires SB being configured to drive a plurality of blue-light subpixel elements 231 distributed in the same column; and white source driving wires SW, which are electrically connected to source electrodes of thin film transistors for driving the white-light subpixel elements 241, respectively, each column of the white source driving wires SW being configured to drive a plurality of white-light subpixel elements 241 distributed in the same column.

The gate driver circuits corresponding to two adjacent rows of the subpixel elements that emit the light in the same color are located at right and left sides of the substrate, respectively; and the source driver circuits corresponding to two adjacent columns of the subpixel elements that emit the light in the same color are located at upper and lower sides of the substrate, respectively.

It should be noted that, the terms of "right", "left", "upper", "lower" and the like are introduced herein merely for ease of description, rather than for limitation.

The above are merely the preferred embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. An organic electroluminescent display panel, comprising:
    a substrate;
    a plurality of subpixel units, which are formed on the substrate and comprise a plurality of red-light subpixel units, a plurality of green-light subpixel units, a plurality of blue-light subpixel units and a plurality of white-light subpixel units, wherein each red-light subpixel unit comprises 4 red-light subpixel elements, each green-light subpixel unit comprises 4 green-light subpixel elements, each blue-light subpixel unit comprises 4 blue-light subpixel elements, each white-light subpixel unit comprises 4 white-light subpixel elements, and the two adjacent subpixel units emit light in different colors, respectively;
    a plurality of thin film transistors, which are electrically connected to the subpixel elements in a one-to-one correspondence manner, for driving the subpixel elements to emit light; and
    a gate driver circuit, a source driver circuit, a plurality of gate driving wires distributed in rows and a plurality of source driving wires distributed in columns, wherein the gate driver circuit is electrically connected to the gate driving wires, for inputting a gate driving signal to the gate driving wires; and the source driver circuit is electrically connected to the source driving wires, for inputting a source driving signal to the source driving wires;
    wherein each pixel region comprises one red-light subpixel element, one green-light subpixel element, one blue-light subpixel element and one white-light subpixel element,
    wherein each of the subpixel elements is arranged between a first electrode and a second electrode and the first electrodes corresponding to different subpixel elements are insulated from each other,
    wherein a source electrode of each of the thin film transistors is electrically connected to the first electrode of one of the subpixel elements, and
    the gate driving wires comprise:
        red gate driving wires, which are electrically connected to gate electrodes of thin film transistors for driving the red-light subpixel elements, respectively, each row of the red gate wires being configured to drive the plurality of red-light subpixel elements distributed in the same row;
        green gate driving wires, which are electrically connected to gate electrodes of thin film transistors for driving the green-light subpixel elements, respectively, each row of the green gate driving wires being configured to drive the plurality of green-light subpixel elements distributed in the same row;
        blue gate driving wires, which are electrically connected to gate electrodes of thin film transistors for driving the blue-light subpixel elements, respectively, each row of the blue gate driving wires being configured to drive the plurality of blue-light subpixel elements distributed in the same row; and
        white gate driving wires, which are electrically connected to gate electrodes of thin film transistors for driving the white-light subpixel elements, respectively, each row of the white gate driving wires being configured to drive the plurality of white-light subpixel elements distributed in the same row,
    the source driving wires comprise:
        red source driving wires, which are electrically connected to source electrodes of thin film transistors for driving the red-light subpixel elements, respectively, each column of the red source driving wires being configured to drive the plurality of red-light subpixel elements distributed in the same column;
        green source driving wires, which are electrically connected to source electrodes of thin film transistors for driving the green-light subpixel elements, respectively, each column of the green source driving wires being configured to drive the plurality of green-light subpixel elements distributed in the same column;
        blue source driving wires, which are electrically connected to source electrodes of thin film transistors for driving the blue-light subpixel elements, respectively, each column of the blue source driving wires are configured to drive the plurality of blue-light subpixel elements distributed in the same column; and
        white source driving wires, which are electrically connected to source electrodes of thin film transistors for driving the white-light subpixel elements, respectively, each column of the white source driving wires being configured to drive the plurality of white-light subpixel elements distributed in the same column;
    the gate driver circuits corresponding to two adjacent rows of subpixel elements that emit the light in the same color are located at right and left sides of the substrate, respectively; and
    the source driver circuits corresponding to two adjacent columns of subpixel elements that emit the light in the same color are located at upper and lower sides the substrate, respectively.

2. The organic electroluminescent display panel according to claim 1, wherein the thin film transistor is a bottom-gate thin film transistor, a top-gate thin film transistor or a co-plane thin film transistor.

3. The organic electroluminescent display panel according to claim 1, wherein each of the subpixel elements of each subpixel unit is a top-emitting element or a bottom-emitting element.

4. The organic electroluminescent display panel according to claim 1, wherein the subpixel elements of each subpixel unit have a shape of a rectangle, a diamond or a trapezoid.

5. The organic electroluminescent display panel according to claim 1, wherein the subpixel elements of each subpixel unit have an identical shape.

6. The organic electroluminescent display panel according to claim 1, wherein the subpixel elements of each subpixel unit have different shapes.

7. The organic electroluminescent display panel according to claim 1, wherein the substrate is a glass substrate, a quartz substrate or an organic resin substrate.

8. The organic electroluminescent display panel according to claim 2, wherein the subpixel elements of each subpixel unit have a shape of a rectangle, a diamond or a trapezoid.

9. The organic electroluminescent display panel according to claim 2, wherein the subpixel elements of each subpixel unit have an identical shape.

10. The organic electroluminescent display panel according to claim 2, wherein the subpixel elements of each subpixel unit have different shapes.

11. The organic electroluminescent display panel according to claim 1, wherein the first electrode is an anode and the second electrode is a cathode.

12. The organic electroluminescent display panel according to claim 11, wherein the second electrode is a plate-shaped electrode covering the whole substrate.

13. The organic electroluminescent display panel according to claim 1, wherein a plurality of banks are formed on the substrate in a crisscross manner for defining regions where the plurality of subpixel units are located.

14. The organic electroluminescent display panel according to claim 1, further comprising an overcoat layer formed on the plurality of thin film transistors, wherein a plurality of grooves are formed on a surface of the overcoat layer backing to the thin film transistors and the first electrode is formed in one of the plurality of grooves.

* * * * *